United States Patent [19]

Brown et al.

[11] 4,056,788
[45] Nov. 1, 1977

[54] DIGITAL-TO-ANALOG NOISE GENERATOR

[75] Inventors: Joel E. Brown, Baltimore; Kelly C. Overman, Pikesville, both of Md.

[73] Assignee: Westinghouse Electric Corporation, Pittsburgh, Pa.

[21] Appl. No.: 737,820

[22] Filed: Nov. 1, 1976

[51] Int. Cl.² ............................................. H03B 29/00
[52] U.S. Cl. ..................................... 331/78; 325/132; 343/18 E
[58] Field of Search .............. 343/18 E; 325/131, 132; 331/78, 178

[56] References Cited

U.S. PATENT DOCUMENTS

| | | | |
|---|---|---|---|
| 3,114,148 | 12/1963 | Lederman | 343/18 E |
| 3,670,333 | 6/1972 | Winn | 343/18 E |

*Primary Examiner*—John Kominski
*Attorney, Agent, or Firm*—H. W. Patterson

[57] ABSTRACT

A noise generator that is responsive to digital noise quality and noise modulation input signals to provide a controller noise signal to a voltage controlled oscillator. The noise generator adds a center frequency input signal, a weighted random noise signal, and a weighted wobbulated waveform signal to obtain a controlled digital noise signal and converts this noise signal from digital form to analog form to provide a noise generator output signal that controls the voltage controlled oscillator. The center frequency and modulation of the noise generator output signal spectrum are determined by the center frequency and weighted wobbulated waveform signals, respectively, and the range of the output signal spectrum is determined by the weighting of the random noise signal. A ramp input signal, which is converted from digital to analog form, is integrated and added to the noise generator output signal to further define the quality and range of the output signal spectrum.

23 Claims, 8 Drawing Figures

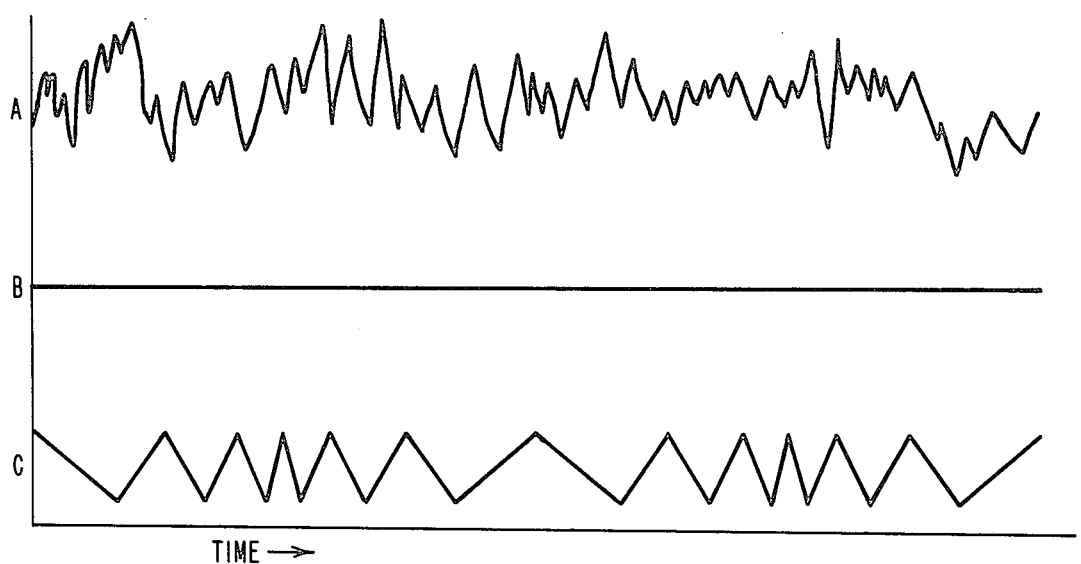
FIG.3
FIG.7
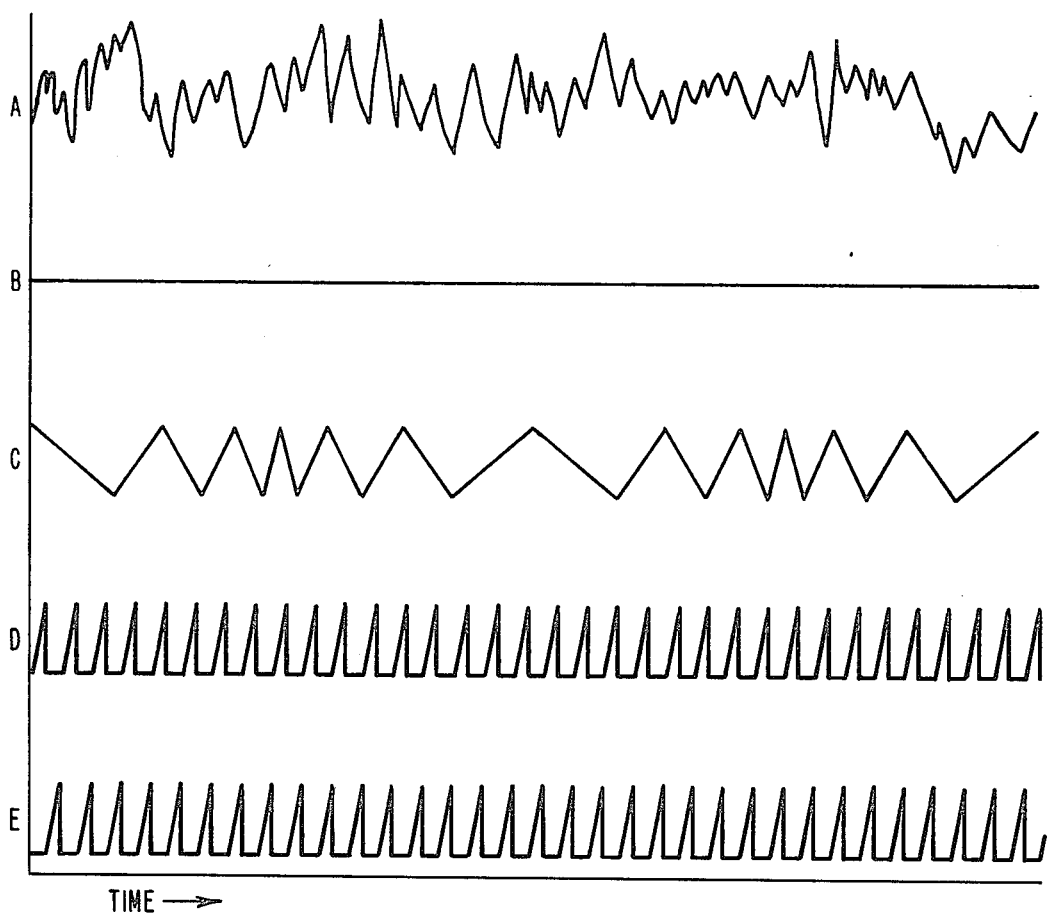

DIGITAL-TO-ANALOG NOISE GENERATOR

BACKGROUND OF THE INVENTION

1. Field of the Invention

The present invention relates to controllers for voltage controlled oscillators and, more particularly, to noise generators that control voltage controlled oscillators as used in radar jammers.

2. Description of the Prior Art

In the practice of the radar art, it is common to limit the detection capabilities of a radar set by deliberately generating external noise of a relatively high power level in comparison to normal receiver noise and directing this generated noise signal at the radar set. Devices for generating such noise signals and transmitting them toward the target radar are commonly known in the radar art as jammers. In radar jammer systems of the prior art, the jamming signal was transmitted in response to a center frequency input signal, noise quality input signals, and noise modulation input signals. Basically, a jammer is comprised of three subsystems: a waveshaping network for providing noise quality and noise modulation signals; a noise generator that generates a noise output signal, the spectrum of the noise output signal being controlled in response to the noise quality and noise modulation signals of the waveshaping network; and a voltage controlled oscillator that transmits a jamming signal in response to the noise output signal.

The random noise signal was usually generated from a source within the noise generator and controlled by the input signals of the waveforming network to generate a noise signal spectrum having predetermined nominal frequency, quality and modulation. In the prior art, the spectrum of the noise generator output signal was controlled in response to a center frequency control signal that determined the center of the spectrum range, noise quality input signals that determined the quality and range of the spectrum, and noise modulation input signals that controlled the modulation of the spectrum. As generally known in the art, the center frequency input signal which determined the nominal location of the generated noise signal spectrum, was a substantially constant level signal and afforded a potential for tuning the noise spectrum to a particular nominal value by adjusting the level of the center frequency input signal. The noise quality input signals which controlled the quality or type of generated noise signal included the random noise signal itself and a control signal of some predetermined function as, for example, a ramp function control signal. The control signal such as the ramp signal was provided to obscure the definition of discrete values in the generated noise signal spectrum. The noise quality input signals also included control signal bandwidth and noise bandwidth input signals that determined the range of the generated noise signal spectrum. The noise modulation input signals that controlled the modulation of the noise signal spectrum included wobbulated waveform and wobbulated bandwidth input signals. As the use of the term "wobbulated" suggests, these input signals were periodic signals of some predetermined shape in which the period of the signal was modulated in a periodic manner.

However, in previous jamming systems, the center frequency noise quality and noise modulation input signals provided to the noise generator were combined with the random noise signal in analog form. Where the input signals provided to the noise generator were in digital form, these signals were converted to analog form prior to their combination with the other input signals and the random noise signal. For many applications of such prior art jammers, the relatively slow response times of currently available amplifiers required the use of several parallel signal channels which were then multiplied together and provided to a single driver circuit to generate a noise spectrum in the required time. To simultaneously provide a plurality of noise spectrums the driver circuit was multiplexed between a plurality of multiples, each of which generated the noise spectrum. The stringent switching speed requirements for the multiplexer and driver circuit to simultaneously provide a plurality of noise signal spectrums became difficult to attain. Furthermore, due to the relatively large number of components required for the construction of the parallel channels, MHP or other high density packaging technology was frequently used in applications where the physical size of the jammer was a limiting factor. However, such high density packaging technology made the jammers relatively expensive and significantly increased the time required for their construction.

Therefore, there was a need in the prior art for a noise generator that was better adapted for operating at the relatively high speeds required to simultaneously generate a plurality of noise spectrums and which would not incur the expense and production difficulties commonly experienced with high density packaging technology.

SUMMARY OF THE INVENTION

In accordance with the present invention, a noise signal generator generates a noise signal whose spectrum quality and character are controlled in response to noise quality and noise modulation input signals. A center frequency input signal, a weighted noise signal from a random noise source, and a weighted modulation signal are provided to an adder and added in their digital form. The sum of these signals is provided by the adder to a digital-to-analog converter which converts the sum signal from a digital form to an analog form.

BRIEF DESCRIPTION OF THE DRAWINGS

FIG. 3 shows waveforms that illustrate a typical random noise signal and typical center frequency and wobbulated waveform input signals;

FIG. 7 illustrates a random noise signal, center frequency and wobbulated waveform input signals, and a control input signal for a typical operation of the embodiment of FIG. 6.

THE PREFERRED EMBODIMENT OF THE INVENTION

Figure 1:
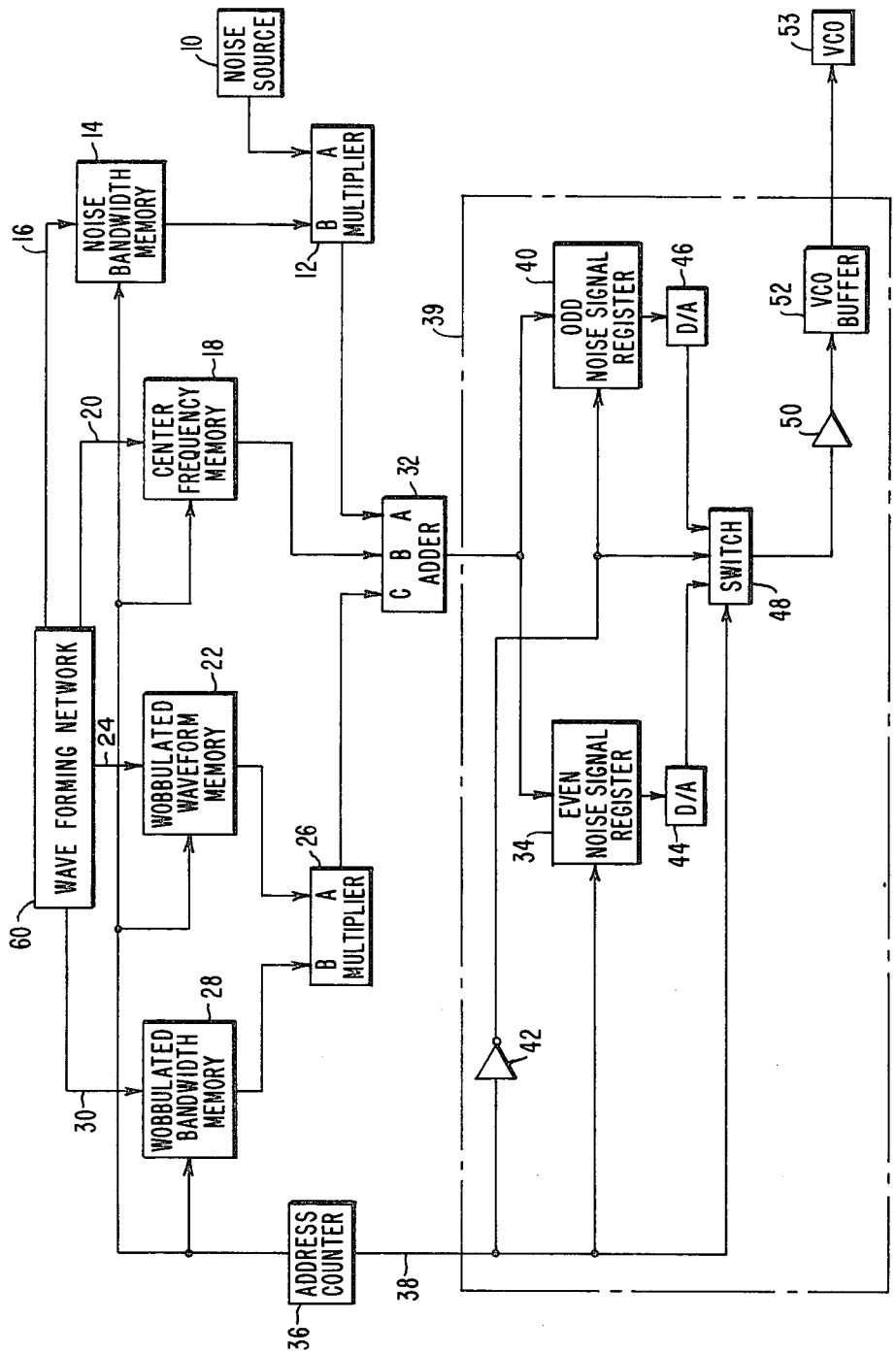
FIG. 1 is a block diagram of the preferred embodiment of the present invention.

A block diagram of the preferred embodiment of the disclosed noise generator is shown in FIG. 1. The controller includes a random noise source 10 which, for the examle of the preferred embodiment, is comprised of a thermal diode. The output of the random noise source 10 is provided to terminal A of a multiplier 12 which is also operative through its terminal B with a noise bandwidth memory 14 that is responsive to noise bandwidth input signals on line 16. The generator also includes a center frequency memory 18 that is responsive to center frequency input signals provided on line 20. A wobbulated waveform memory 22 that is responsive to wobbulated waveform input signals provided on line 24 is operative with terminal A of a multiplier 26 and a wobbulated bandwidth memory 28 is operative with terminal B of the multiplier 26. The wobbulated bandwidth memory 28 is responsive to wobbulated bandwidth input signals provided on line 30.

An adder 32 is responsive to the outputs of the multiplier 12, the center frequency memory 18, and the multiplier 26 through terminals A, B and C, respectively, to provide a digital noise signal to an even center frequency register 34 in response to an enable signal provided by an address counter 36 on line 38, and to provide the digital noise signal to an odd center frequency register 40 in response to the enable signal provided on line 38 as inverted by the inverter 42. The address counter 36 further serves to address the memory locations of the noise bandwidth memory 14, the center frequency memory 18, the wobbulated waveform memory 22, and the wobbulated bandwidth memory 28. The output of the even center frequency register 34 is provided to a first digital-to-analog converter (D/A converter) 44 and the output of the odd center frequency register 40 is provided to a second digital-to-analog converter (D/A converter) 46. A digital switch 48 is responsive to the enable signal on line 38 and to the inverted enable signal provided by the inverter 42 to selectively connect an amplifier to the D/A converter 44 or the D/A converter 46. The output of the amplifier 50 is provided to a voltage controlled oscillator buffer (VCO buffer) 52. The output of the VCO buffer 52 is provided to a voltage controlled oscillator 53 that transmits a jamming signal in accordance with the output of the disclosed noise generator. The analog output of the digital-to-analog noise generator is shown in waveform 2-A of FIG. 2 for a single spectrum of the noise generator output signal. As shown in waveform 2-A, the noise signal spectrum, which is generally known to those skilled in the art as a noise spot, is actually comprised of a number of voltage values having a common power magnitude. These voltage values are in close proximity with respect to each other, but, for purposes of illustration, the distances between these values have been greatly exaggerated in waveform 2-A. As used in radar jammers, the noise signal spectrum is controlled so that the corresponding bandwidth of the voltage controlled oscillator extends over the detection frequency range of the receiver in the targeted radar set. To tune the noise signal spectrum to a particular nominal value, the noise generator is provided with a center frequency signal having a substantially constant voltage corresponding to the desired frequency of the voltage controlled oscillator 53. A random noise signal is superimposed over this constant potential center frequency signal to cause the output of the voltage controlled oscillator 53 to transmit a signal at various frequencies surrounding the center frequency depending upon the random variations in the noise signal. The amplitude of these random noise signal variations determines the voltage range at which the noise signal will deviate from the nominal frequency, thereby controlling the bandwidth of the jamming signal spectrum provided by the voltage controlled oscillator. This voltage range is indicated in waveform 2-A by $\beta$. The power of each spectral value in the noise signal power spectrum is dependent upon the time at which the noise signal generator remains at that voltage.

The random noise signal which causes the transmitted signal to fluctuate in a random fashion about the center frequency is determined by the frequency of the noise signal. Typically, this frequency is on the order of megacycles. As known in the art, by applying the wobbulated waveform, a voltage signal of much lower frequency, the entire noise signal spectrum can be modulated about the nominal center voltage of the voltage range $\beta$, as illustrated by the waveform 2-B. In waveform 2-B, the noise signal spectrum of waveform 2-A is illustrated as having a modulation about the nominal center voltage where the extreme positions are indicated by the characters A and A'. Therefore, the voltage range $\beta$ can be controlled by controlling the amplitude of the random noise signal and the amplitude of the noise signal spectrum modulation can be controlled by controlling the amplitude of the wobbulated waveform signal. Typically, the amplitude modulation signal is on the order of tens of cycles per second in comparision with the megacycle frequency of the noise signal. A common requirement of noise generators as used in radar jammers is that the noise generators simultaneously provide a plurality of noise signal spectrums to cause the voltage controlled oscillator 53 to simultaneously transmit a plurality of jamming signal spectrums. In the particular example of waveform 2-C, four noise signal spectrums having different nominal center voltages and voltage ranges are generated. In waveform 2-D, it is further illustrated that these four power spectrums are modulated by different wobbulation waveforms.

In the operation of the noise generator of FIG. 1, a noise bandwidth input signal, a center frequency input signal, a wobbulated waveform input signal, and a wobbulated bandwidth input signal are provided on lines 16, 20, 24 and 30, respectively, by a waveforming network 60. The noise bandwidth input signal provided on line 16 is stored in the noise bandwidth memory 14, the center frequency input signal provided on line 20 is stored in the center frequency memory 18, the wobbulated waveform input signal provided on line 24 is stored in the wobbulated waveform memory 22, and the wobbulated bandwidth input signal provided on line 30 is stored in the wobbulated bandwidth memory 28 at an address indicated by the address counter 36. The random noise source 10 continuously provides a random noise signal to terminal A of the multiplier 12. A typical example of the output of the random noise source 10 is illustrated in waveform 3-A of FIG. 3. When the address counter 36 accesses the address in the noise bandwidth memory 14 at which the noise bandwidth input signal is stored, the noise bandwidth signal is provided to terminal B of the multiplier 12. The multiplier 12 operates to multiply the random noise signal of the random noise source 10 by the noise bandwidth signal from the noise bandwidth memory 14 to provide a noise product signal. Assuming that the noise bandwidth signal of the noise bandwidth memory 14 is unity, the output of the multiplier 12 will be the random noise signal provided to terminal A of the multiplier 12 from the random noise source 10 illustrated by the waveform 3-A of FIG. 3. The product of the random noise signal and the noise bandwidth signal is provided by the multiplier 12 to terminal A of the adder 32 which is also responsive to the center frequency memory 18 and the multiplier 26.

At the time that the address of the noise bandwidth memory 14 is accessed by the address counter 36, the address of the center frequency memory 18 which corresponds to the address of the noise bandwidth signal of the memory 14 is also accessed by the address counter 36, causing the center frequency memory 18 to provide a center frequency signal to terminal B of the adder 32. Typically, this signal is a constant input which is illustrated by the waveform 3-B of FIG. 3.

At the time when the addresses of the noise bandwidth memory 14 and the center frequency memory 18 are accessed, the address counter 36 also accesses corresponding memories in the wobbulated waveform memory 22 and the wobbulated bandwidth memory 28. The wobbulated waveform signal provided to the wobbulated waveform memory 22 on line 24 determines the character of the modulation of the transmitted signal. Generally, this signal is a frequency modulated, periodic waveform of a predetermined shape. A typical such wobbulated waveform is illustrated in FIG. 3-C of FIG. 3. However, it is to be understood that the particular shape or character of the wobbulated waveform is dependent upon the waveshaping network 60 which provides the input signals to the noise generator so that the wobbulated waveform may be a sinusoidal, sawtooth, or some other waveform which is considered to be desirable for the particular application of the noise generator. This waveform is generally frequency modulated and, hence, has become to be known to those skilled in the radar art as a wobbulated waveform. The wobbulated waveform which is stored in the wobbulated waveform memory 22 is provided to terminal A of the multiplier 26. In the multiplier 26, the wobbulated waveform is amplitude modulated by the wobbulated bandwidth signal which is provided to terminal B of the multiplier 26 in response to the access signal of the address counter 36. For the present illustration, it will be assumed that the wobbulated bandwidth signal is unity so that the output of the multiplier 26 is substantially equivalent to the input to terminal A from the wobbulated waveform memory 22. The output of the multiplier 26 is provided to terminal C of the adder 32.

The adder 32 provides a digital noise signal in accordance with the inputs to terminals A, B and C which determine the quality, center frequency, and modulation of the noise signal, respectively. For the example of the waveforms illustrated in FIG. 3 in which it is assumed that the noise bandwidth signal is unity, the random noise signal of the random noise source will determine both the quality and the bandwidth of the digital noise signal provided by the adder 32. By control of the quality of the digital noise signal, it is meant that the degree of randomness in the digital noise signal is directly dependent upon the degree of randomness in the random noise signal of the random noise source 10. For example, if the random noise source is comprised of a noise source other than a thermal diode, the random noise signal will exhibit a characteristic randomness which may be distinguishable from the random signals characteristic of thermal diodes. Therefore, the quality, or degree of randomness, of the random noise source 10 will directly affect the quality, or degree of randomness, of the digital noise signal provided by the adder 32. When, as in the present example, the noise bandwidth signal provided by the noise bandwidth memory 14 is unity, the amplitude random noise signal of the noise source 10 is determinate of the range of the noise spectrum of the adder 32. As will be explained in relation to FIG. 4, in cases where the noise bandwidth signal of the noise bandwidth memory 14 is other than unity, the noise bandwidth signal cooperates with the amplitude of the random noise signal of the noise source 10 to determine the range of the noise spectrum of the adder 32.

The center frequency signal provided to terminal B of the adder 32 from the center frequency memory 18 determines the center frequency of the digital noise signal spectrum. The center frequency signal is generally a constant potential signal and is used to tune the spectrum of the digital noise signal to a particular nominal value. Although the center frequency signal may be adjusted periodically to tune the digital noise signal spectrum to a different nominal value, or sometimes is varied at a frequency much slower than the frequencies of the other control signals of the waveshaping netwrk, the center frequency signal is usually maintained at a constant potential during the operation of the noise generator.

The wobbulated waveform signal provided to terminal A of the multiplier 26 by the wobbulated waveform memory 22 determines the modulation of the spectrum of the digital noise signal provided by the adder 32. In the present case where the wobbulated bandwidth signal of the wobbulated bandwidth memory 28 is unity, the character of the wobbulated waveform controls the modulation of the digital noise signal spectrum. The reference to the characteristic of the wobbulated waveform refers to the particular shape of the waveform which, as explained previously, is determined by the waveshaping network. Accordingly, the modulation of the digital noise signal spectrum is controlled by the waveshape or character of the wobbulated waveform signal. For the example of the waveform 3-C in FIG. 3, it is shown that the digital noise signal spectrum is modulated about the center frequency established by the center frequency control signal in a linear fashion. It is further shown that the waveform 3-C is frequency modulated, or wobbulated, to vary the rate of the linear modulation of the power spectrum. For the example of the waveforms of FIG. 3, the wobbulated bandwidth signal of the wobbulated bandwidth memory 28 is unity so that the wobbulated waveform of the wobbulated waveform memory 22 directly determines the noise signal spectrum modulation. The adder 32 therefore operates to add the random noise signal provided by the noise source 10 through the multiplier 12, the center frequency signal of the center frequency memory 18, and the wobbulated waveform signal provided by the wobbulated waveform memory 22 through the multiplier 26. Since the sum of these signals determines the digital noise signal, the random noise signal spectrum is controlled in response to the center frequency signal and in response to the wobbulated waveform signal.

Typically, a voltage controlled oscillator (not shown) which is a well known device that transmits a signal whose frequency is dependent upon the voltage level of an analog input signal, is responsive to the output signal of the noise generator to provide a jamming signal. Since the digital noise signal provided by the adder 32 is in digital form and voltage controlled oscillators provide an output signal whose frequency is dependent on the level of an analog voltage signal, the digital noise signal must be converted to analog form before being applied to the voltage controlled oscillator. Accordingly, the preferred embodiment further includes a means for converting the digital noise signal of the adder 32 to an analog voltage signal. In the preferred embodiment of FIG. 1, this conversion is accomplished by the D/A converters 44 and 46. Cs will be further explained in relation to the waveforms of FIG. 5, the digital noise signal of the adder 32 is alternately switched between the D/A converters 44 and 46 to accomplish this digital to analog conversion.

As was previously explained for the example of FIG. 3, the random noise signal, center frequency signal and wobbulated waveform signal are provided to the adder 32 from which the digital noise signal was generated. From FIG. 3 it will be appreciated that by weighting the random noise signal of the noise source 10 and the wobbulated waveform of the wobbulated waveform memory 22, additional degrees of control can be exercised on the digital noise signal. More specifically, by multiplying the random noise signal of the noise source 10 by a known factor, the amplitude of the random noise signal can be controlled, thereby controlling the range of the noise signal spectrum. Similarly, by multiplying the wobbulated waveform signal by a known factor, the amplitude of the modulation of the digital noise signal spectrum can be controlled. To weight the random noise signal of the random noise source 10, a known factor is provided as a noise bandwidth signal to the noise bandwidth memory 14 which is operative with the multiplier 12. The multiplier 12 then operates to multiply the random noise signal of the noise source 10 by the noise bandwidth signal applied to terminal B of the multiplier 12 by the noise bandwidth memory 14. The weighting factor by which the wobbulated waveform signal is to be multiplied is applied as the wobbulated bandwidth signal from the wobbulated bandwidth memory 28 which is operative with the multiplier 26.

Figure 4:
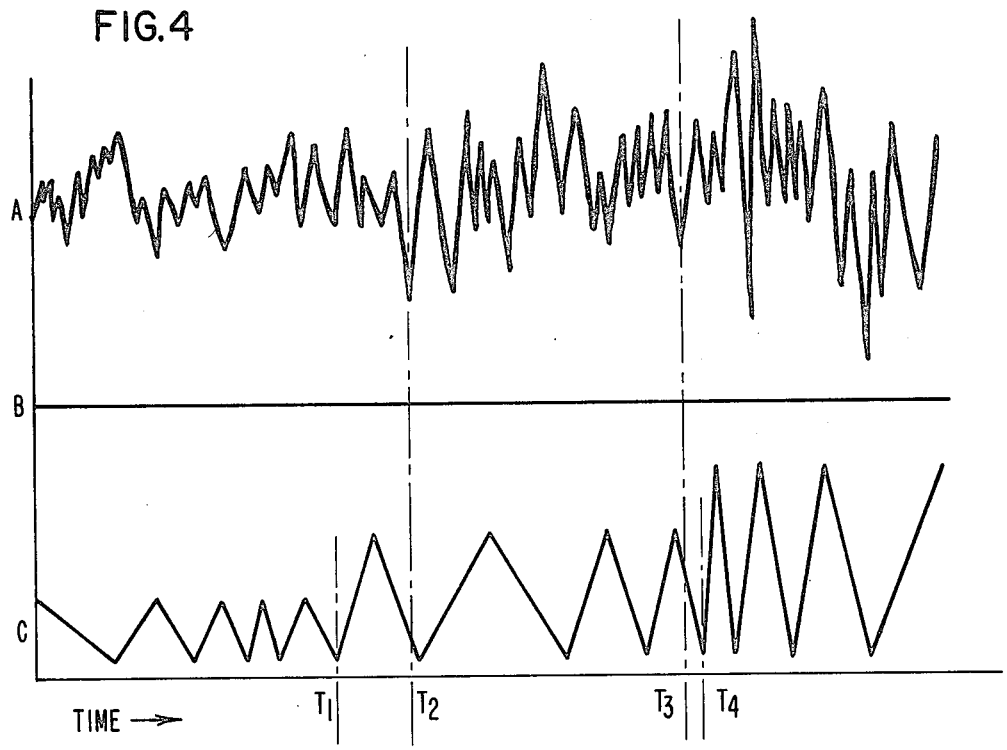
FIG. 4 shows the waveforms of FIG. 2 as they would be modified by typical noise bandwidth and wobbulated bandwidth input signals.

FIG. 4 shows an example of the additional control provided by multiplying the random noise signal by the noise bandwidth signal in the multiplier 12, and by multiplying the wobbulated waveform signal by the wobbulated bandwidth signal in the multiplier 26. Given the same noise signal, center frequency, and wobbulated waveform signals as shown in waveforms 3-A, 3-B and 3-C, respectively, waveform 4-C of FIG. 4 shows that, at time $T_1$, the wobbulated bandwidth signal provided by the wobbulated bandwidth memory 28 increases from unity to a factor of two to cause the amplitude of the wobbulated waveform signal to double, thereby doubling the modulation of the noise signal spectrum. Waveform 4-A of FIG. 4 shows that at time $T_2$, the noise bandwidth signal of the noise bandwidth memory 14 increases from unity to a factor of two, causing the amplitude of the random noise signal provided by the noise source 10 to double, thereby also doubling the range of the noise signal spectrum. Waveform 4-A also shows that, at time $T_3$, the noise bandwidth signal provided by the noise bandwidth signal provided by the noise bandwidth memory 14 is further increased to a factor of three to triple the amplitude of the random noise signal provided by the multiplier 12 to the adder 32, thereby tripling the range of the noise signal spectrum. Finally, waveform 4-C shows that at time $T_4$, the wobblated bandwidth signal is increased to a factor of three to triple the amplitude of the wobbulated waveform signal provided by the multiplier 26 to terminal C of the adder 32, thereby tripling the modulation amplitude of the noise signal spectrum.

Although, for the particular example of the waveforms illustrated in FIG. 3, the noise bandwidth signal of the noise bandwidth memory 14 and the wobbulated bandwidth signal of the wobbulated bandwidth memory 28 were increased by integral multiples to a factor of greater than unity, it will be apparent that the preferred embodiment is equally applicable to noise bandwidth and wobbulated bandwidth signals which provide a factor of less than unity and/or other than integral multiples of unity.

Figure 2:
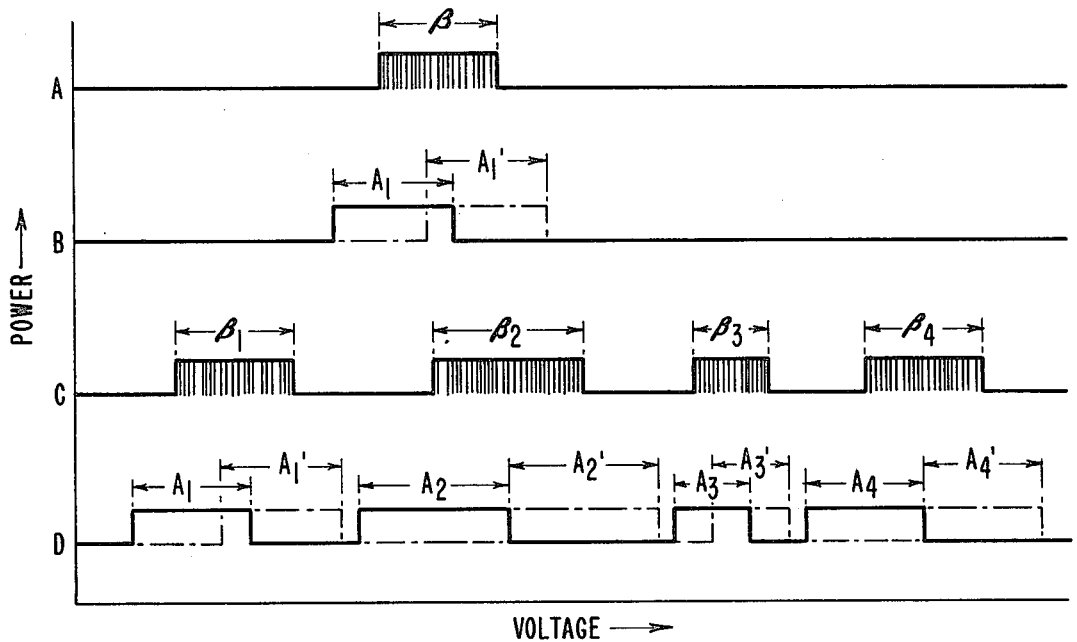
FIG. 2 illustrates exemplary noise signal power spectrums which are used to describe a typical operation of the disclosed signal generator.

For the single power spectrum which is illustrated in waveform 2-A of FIG. 2, the converter 39 of the preferred embodiment of FIG. 1 could be comprised of a single D/A converter which would be responsive to the output of the adder 32. However, a common requirement of noise generators as used in radar jammers is that the noise generators simultaneously provide a plurality of noise signal spectrums to cause the voltage controlled oscillator to simultaneously transmit a plurality of jamming signal spectrums. In accordance with the previously described digital mechanization of the preferred embodiment, the simultaneous transmission of a plurality of noise signal spectrums is efficiently accomplished by successively accessing the addresses of the noise bandwidth memory 14, the center frequency memory 18, the wobbulated waveform memory 22, and the modulated bandwidth memory 28 corresponding to each of the noise signal spectrums which are to be transmitted. For the example of waveforms 2-C and 2-D of FIG. 2, four addresses of each of the memories 14, 18, 22 and 28 corresponding to the four respective noise signal spectrums are successively accessed. For each address signal of the address counter 36, the center frequency memory 18 provides a center frequency to terminal B of the adder 32. Corresponding to each address of the center frequency memory 18, the noise bandwidth memory 14 is addressed and provides a noise bandwidth signal to terminal B of the multiplier 12, which weights the random noise signal of the random noise source 10 and provides this weighted random noise signal to terminal A of the adder 32. Also, corresponding to the addresses of the center frequency memory 18 and the noise bandwidth memory 14, the wobbulated waveform memory 22 provides the wobbulated waveform signal to terminal A of the multiplier 26 which weights this signal in accordance with the wobbulated bandwidth signal of the wobbulated bandwidth memory 28 and provides the weighted wobbulated waveform signal to terminal C of the adder 32. The adder 32 then determines the sum of the input signals to generate the digital noise signal. The digital noise signal for the next noise signal spectrum is then produced by causing the address counter 36 to access the corresponding addresses of the memories 14, 18, 22 and 28.

As was previously explained, the power level of each noise signal spectrum is dependent upon the time for which the noise generator output signal is sustained at the spectral voltage value. When the noise generator is required to simultaneously generate a plurality of noise signal spectrums, rapid switching from the digital noise signal corresponding to one noise signal spectrum to the digital noise signal corresponding to the succeeding noise signal spectrum is often required to attain a signal of sufficient power level. For many applications, such as a noise generator used in a radar jammer, the switching requirements between the spectral voltage values of successive noise signal spectrums is beyond the capabilities of D/A converters such as are currently available. For example, in a noise generator used in a radar jammer, a typical requirement is that the generator be switched from one noise signal spectrum to a succeeding noise signal spectrum in less than 10 nanoseconds in order that the noise generator generate a noise signal of sufficient duration to achieve a power level for the noise signal spectrums that will be effective in jamming the receiver of the target radar set. However, currently available D/A converters are not capable of converting the digital noise signal to its analog equivalent in this time period. Accordingly, in the preferred embodiment the converter 39 includes a first combination of the even center frequency register 34 and the D/A converter 44 and a second combination of the odd center frequency register 40 and the D/A converter 46. The two combinations of frequency registers and D/A converters are selectively connected to the output amplifier 50 in accordance with alternative outputs of the address counter 36. This mechanism for alternately connecting the digital noise signal of the adder 32 to two frequency register — D/A converter combinations greatly relaxes the operational requirements of the D/A converters 44 and 46, permitting the use of presently commercially available devices.

In the preferred embodiment of FIG. 1, the least significant bit of the address signal provided by the address counter 36 is conducted over line 38 to the converter 39 and is applied to the even noise signal register 34 and the switch 48. The least significant bit conducted on line 38 is also provided to the inverter 42 whose output is conducted to the odd noise signal register 40 and the switch 48. In the operation of the converter of FIG. 1, when the address signal of the address counter 36 is even, the signal on line 38 causes the even noise signal register 34 to register the digital noise signal of the adder 32 and the switch 48 is connected to the D/A converter 44. The D/A converter 44 then converts the digital noise signal registered in the even noise signal register 34 to an analog equivalent which is conducted through the switch 48, amplified by the amplifier 50 and stored in a VCO buffer 52. For an even numbered address signal by the address counter 36, the signal conducted on line 38 is inverted by the inverter 42 so that the odd noise signal register 40 does not register the output of the adder 32. Conversely, when the address signal of the address counter 36 is odd, the signal provided on line 38 does not enable the even noise signal register 34 to register the digital noise signal of the adder 32. However, the signal provided on line 38 is inverted by the inverter 42 to cause the odd noise signal register 40 to register the digital noise signal of the adder 32 and to cause the switch 40 to connect the amplifier 50 to the D/A converter 46. The D/A converter 46 then converts the digital noise signal of the adder 32 which is register in the odd noise signal register 40 to its analog equivalent. This analog signal is then conducted through the switch 48, amplified by the amplifier 50 and stored in the VCO buffer 52. The VCO buffer 52 stores the converted digital noise signal of the adder 32 to the voltage controlled oscillator until the next analog noise signal is provided by the amplifier 50.

Figure 5:
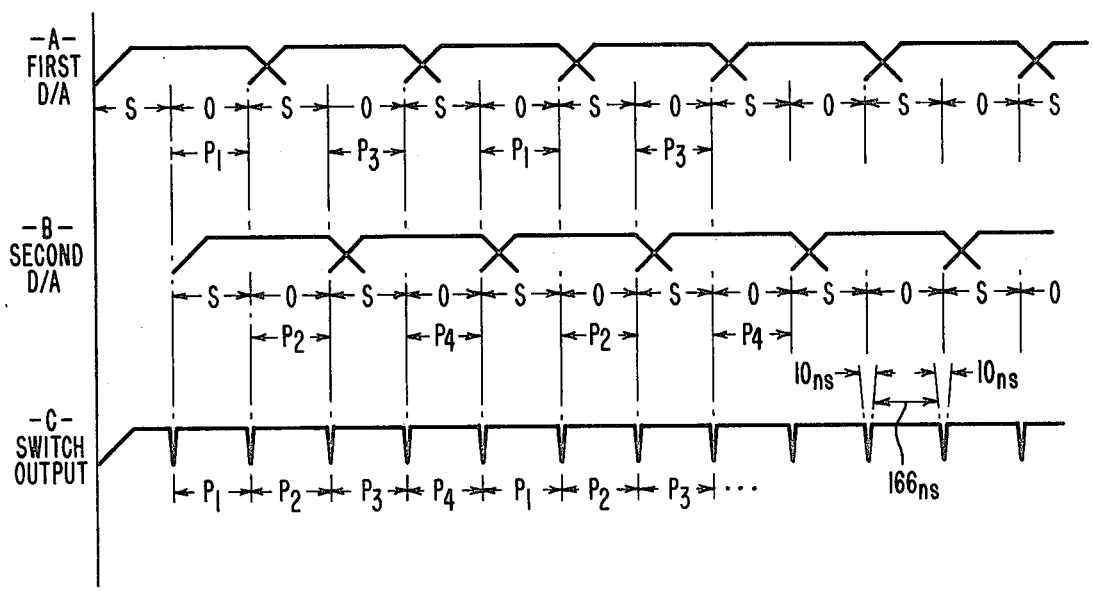
FIG. 5 shows waveforms that illustrate the operation of the noise generator of the present invention.

The operation of the converter 39 of FIG. 1 is further illustrated in relation to FIGS. 5A, 5B and 5C of FIG. 5. Waveform 5-C illustrates the output from the switch 48 which is required to cause the VCO to transmit noise signals of sufficient duration to achieve a required power level. The waveform 5-C illustrates that the switch 48 of FIG. 1 must provide an output to the VCO buffer 52 through the amplifier 50 for periods of 166 nanoseconds with ten nanosecond periods between successive outputs of the switch permitted for switching from the noise signal of one power spectrum to the noise signal of the succeeding power spectrum. The output of the D/A converter 44 is illustrated by the waveform 5-A and the output of the D/A converter 46 is illustrated by the waveform 5-B. As shown by the waveforms 5-A and 5-B, the D/A converters 44 and 46 are permitted 166 nanoseconds of settling time (S) or time during which initial transient conditions are permitted to settle out. After the 166 nanosecond settling time has elapsed, the D/A converters provide an analog output signal for an output period (0) of 166 nanoseconds during which time the D/A converters are selectively operative with the amplifier 50 through the switch 48 to provide the converted digital noise signal to the VCO buffer. As is illustrated in waveforms 5A and 5B, the timing of the respective D/A converters 44 and 46 is staggered such that the settling time (S) of one D/A converter comports with the output time (0) of the other D/A converter. Therefore, while the D/A converter 44 is progressing through its settling time, the D/A converter 46 is providing an output to the VCO buffer 52, and, similarly, while the D/A converter 46 is progressing through its settling time, the D/A converter 44 is providing an output signal to the VCO buffer 52. Therefore, although no D/A converter having a settling time (S) as short as ten nanoseconds is commercially available at this time, the present invention selectively switches between two D/A converters whose timing is staggered such that they alternatively provide an output to the VCO buffer 52 through the switch 48. When generating a noise signal which would cause the transmitter to produce the four noise signal spectrums $P_1$, $P_2$, $P_3$ and $P_4$ illustrated in the waveforms 2-C and 2-D, the address counter 36 would provide an enable signal over line 38 which would cause the D/A converter 44 to convert the digital noise signals of the adder 32 corresponding to the second and fourth noise signal spectrums $P_2$ and $P_4$. The enable signal provided on line 38 by the address counter 36 to the odd noise signal register 40 would cause the D/A converter 46 to provide an analog signal in response to the digital noise signal of the adder 32 corresponding to the first and third noise signal spectrums $P_1$ and $P_3$. Accordingly, by alternatively switching between the D/A converters 44 and 46, the VCO buffer 52 is provided with analog voltages corresponding to the spectral values in the first, second, third and fourth noise signal spectrums, consecutively, as illustrated in waveforms 2-C and 2-D. After the analog signal corresponding to the spectral line in the noise signal spectrum $P_4$ is provided to the VCO buffer 52, the address counter 36 returns to the address corresponding to the noise signal spectrum $P_1$ and an analog signal corresponding to this noise signal spectrum is provided by the D/A converter 46.

Although, as previously described, the settling time requirements of the D/A converters 44 and 46 have been greatly relaxed by employing these D/A converters in an alternative mode, the requirement of ten nonoseconds switching time between voltage outputs of the noise generator representing successive noise signal spectrums still persists. However, this requirement may be satisifed by comprising the switch 48 of commercially available solid state components. In one embodiment of the present invention which was actually constructed, the switch 48 included silicone insulated, gated field effect transistors of the N-channel enhancement mode type with low on resistance and low capacitance, such as the Signetics SD-210 and SD-211.

As a modification of the embodiment of FIG. 1, the rate of switching between D/A converters 44 and 46 as described above and as illustrated in FIG. 5 can also be made irregular to further enhance the random nature of the noise generator output signal spectrum. With regard to FIG. 5, the switching rate of the switch 48 was described as occurring at regular intervals of 166 nanoseconds. However, this switching can be varied within a predetermined range to vary the power level of the noise signal spectrum. In FIG. 2, this would have the effect of creating a random amplitude modulation in the envelope of the output noise spectrum. There are many mechanisms which are suitable for appropriately varying the switching rate of the switch 48. One such mechanism is to control the count rate of the address counter 36 thereby controlling the duration of the enable signal on line 38 to control the switching rate of the switch 48. For this mechanism, the count rate of the address counter is set at one of three possible count rates in response to the signs of numbers produced by a four quadrant random number generator. For example, when the output of the random number generator is in the first and third quadrants, the address counter would respond by counting at a rate that resulted in a switching time of 166 nanoseconds for the switch 48 as is illustrated in waveform 5-C. However, when the output of the number generator was in the second quadrant, the address counter 36 would count at a rate that resulted in a 150 nanosecond switching rate for the switch 48 and when the output of the number generator was in the fourth quadrant, the address counter 36 would count at a rate that resulted in a 180 nanosecond switching rate for the switch 48. While the switching rate could be similarly set to any desired value, the slowest switching rate for the switch 48 is limited by the rate at which the random noise generator must produce noise signal spectrums, and the fastest switching rate of the switch 48 is limited by the settling time of the D/A converters 44 and 46 and/or by the required power level of the output signal spectrum.

Figure 6:
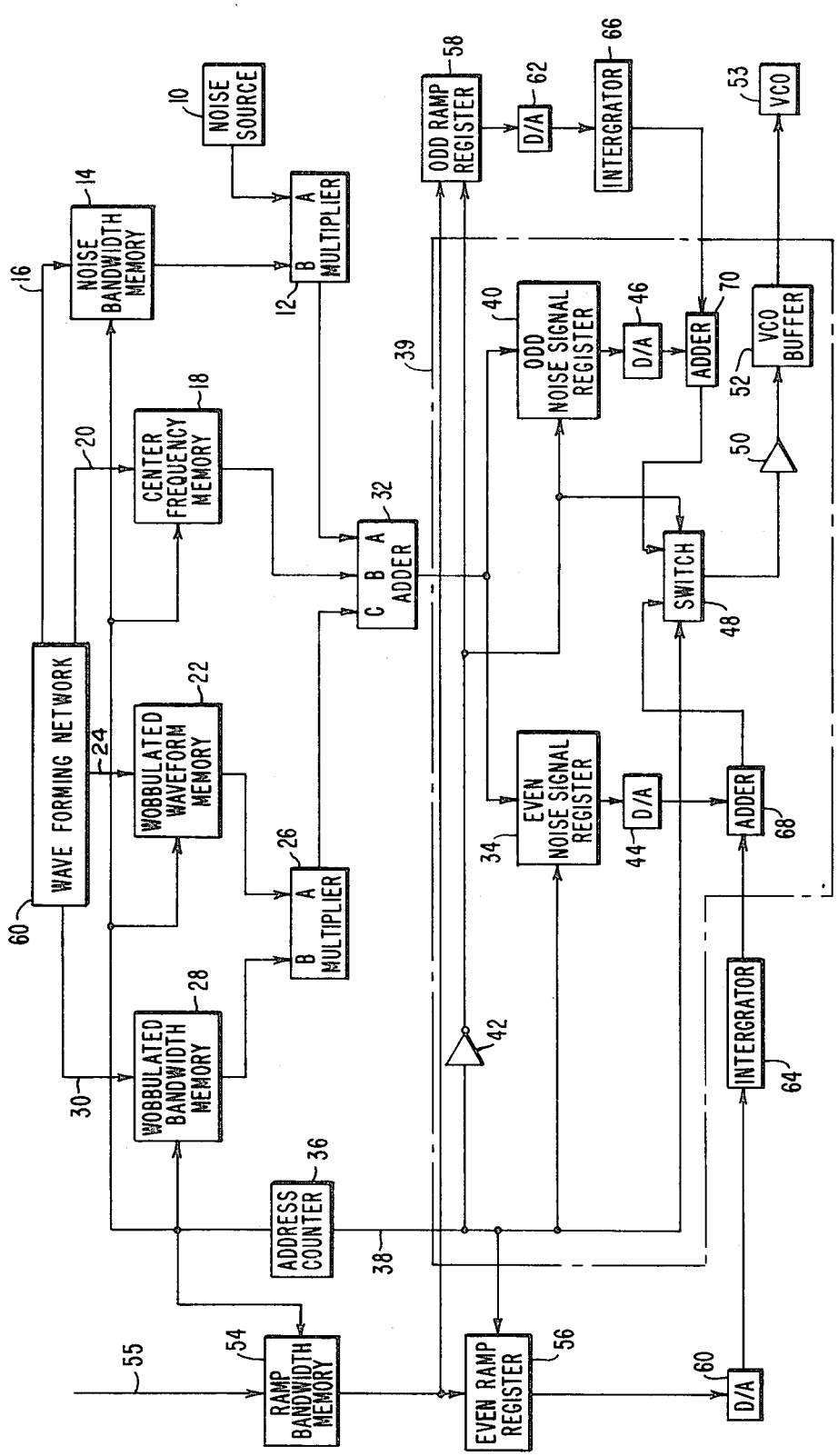
FIG. 6 is a block diagram of an alternative embodiment of the present invention.

An alternative embodiment of the noise generator of FIG. 1 is shown in the block diagram of FIG. 6. The noise generator of FIG. 6 is substantially the same as the noise generator of FIG. 1 with the modification that the noise generator of FIG. 6 also includes a means for further controlling the quality of the generator noise signal in response to a ramp input signal. As shown in FIG. 6, this means for further controlling the quality of the transmitted noise signal spectrum includes a ramp bandwidth memory 54, an even ramp register 56, an odd ramp register 58, D/A converters 60 and 62, integrators 64 and 66, and adders 68 and 70. In the operation of the embodiment of FIG. 6, the adder 32 adds the weighted random noise signal of the noise source 10, the center frequency signal of the center frequency memory 18, and the weighted wobbulated waveform signal of the wobbulated waveform memory 22 to provide the digital noise signal in the manner previously described with reference to FIG. 1. The digital noise signal of the adder 32 is then provided to the converter 39 and is converted to an analog voltage for controlling the frequency of a voltage controlled oscillator in the manner which was also described in relation to FIGS. 1 and 5. However, in addition, the ramp bandwidth memory 54 is responsive to a ramp magnitude signal provided on an input line 55 to the address signal provided by the address counter 36. The even ramp register 56 is responsive to the output of the ramp bandwidth memory 54 and is also responsive to the enable signal provided on line 38 by the address counter 36. Similarly, the odd ramp register 58 is responsive to the output of the ramp bandwidth memory 54 and to the inverted enable signal provided by the inverter 42. D/A converters 60 and 62 are responsive to the outputs of the even ramp register 56 and the odd ramp register 58, respectively and the integrators 64 and 66 are responsive to the respective outputs of the D/A converters 60 and 62. The adder 68 is responsive to the output of the integrator 64 and also to the output of the D/A converter 44, while the adder 70 is responsive to the output of the integrator 66 and is also responsive to the D/A converter 46. The outputs of adders 68 and 70 are provided to the switch 48.

In the operation of the noise generator shown in FIG. 6, the ramp magnitude signal is conducted on line 55 and stored in the ramp bandwidth memory 54. When the address counter 36 accesses an address in the memories 14, 18, 22 and 28 corresponding to a particular noise signal spectrum, the address counter similarly accesses a corresponding address in the ramp bandwidth 54 causing the ramp bandwidth memory to provide the ramp magnitude signal as an output. This output signal provided by the ramp bandwidth memory 54 is registered in either the even ramp register 56 or the odd ramp register 58, depending upon the enable signal on line 38, such that the operation of the even ramp register 56 is controlled by the enable signal in a manner substantially similar to that described for the even center frequency register 34, and the odd ramp register 58 is controlled in response to an enable signal provided by the inverter 42 in a manner substantially similar to that described with respect to the odd center frequency register 40. The D/A converters 60 and 62 are operative to alternately convert the output of the ramp bandwidth memory 54 to an analog signal in response to the enable signal on line 38, substantially as was described for the D/A converters 44 and 46 with respect to waveforms 5-A and 5-B of FIG. 5. The integrators 64 and 66 are responsive to the output of the D/A converters 60 and 62, respectively, to perform a time integration of the analog output signal of the D/A converters 60 and 62. As is well understood in the art, the integrators 64 and 66 provide a ramp function output in response to an analog output from the D/A converters 60 and 62. These ramp function outputs are illustrated in the waveforms 7-E and 7-F of FIG. 7, which also includes the random noise signal, center frequency signal and wobbulated waveform signal of waveforms 3-A, 3-B and 3-C, respectively, which have been rewritten as waveforms 7-A, 7-B and 7-C. As is well known in the art, the slope of the ramp functions provided by the integrators 64 and 66 will depend on the magnitude of the analog signal provided by the D/A converters 60 and 62, respectively. Also, it will be seen from the waveforms 7-D and 7-E of FIG. 7 that the ramp function outputs of the integrators 64 and 66 are staggered with respect to each other as a consequence of the enable signal provided on line 38 which enables the even ramp register 56 or the odd ramp register 58 in an alternative manner.

The ramp function outputs of the integrators 64 and 66 are provided to the adders 68 and 70, respectively, which add these ramp functions to the output of the D/A converters 44 and 46, respectively. As can be seen from the waveforms of FIG. 7, the frequency of the output signal of the integrator 64 is on the order of the frequency of the random noise signal provided by the noise source 10. Typically, the frequency is in the order of megahertz. The ramp function signal when combined with the output of the D/A converters 44 and 46 operates to lower the degree of definition between the spectral values in the noise signal spectrums of the noise generator output signal. By so lowering the degree of definition between the spectral values of the noise signal spectrums, the ramp function outputs of the integrators 64 and 66 cooperate with the random noise signal of the random noise source 10 to further control the quality of the noise signal spectrum of the noise generator output signal. Since the quality of the noise signal spectrum of the transmitter output signal is dependent on the degree of definition between spectral values of the noise signal spectrum determined by the combination of the ramp function signals with the output of the D/A converters 44 and 46, the ramp function is said to further control the quality of these power spectrums. Also, the frequency of the integrated ramp signal, as determined by the integration period of the integrators 64 and 66, controls the amplitude of the integrated ramp signal. By so controlling the amplitude of the ramp signal, the frequency of the ramp signal cooperates with the noise bandwidth signal of the noise bandwidth memory 14 to determine the range of the noise signal spectrum.

Figure 8:
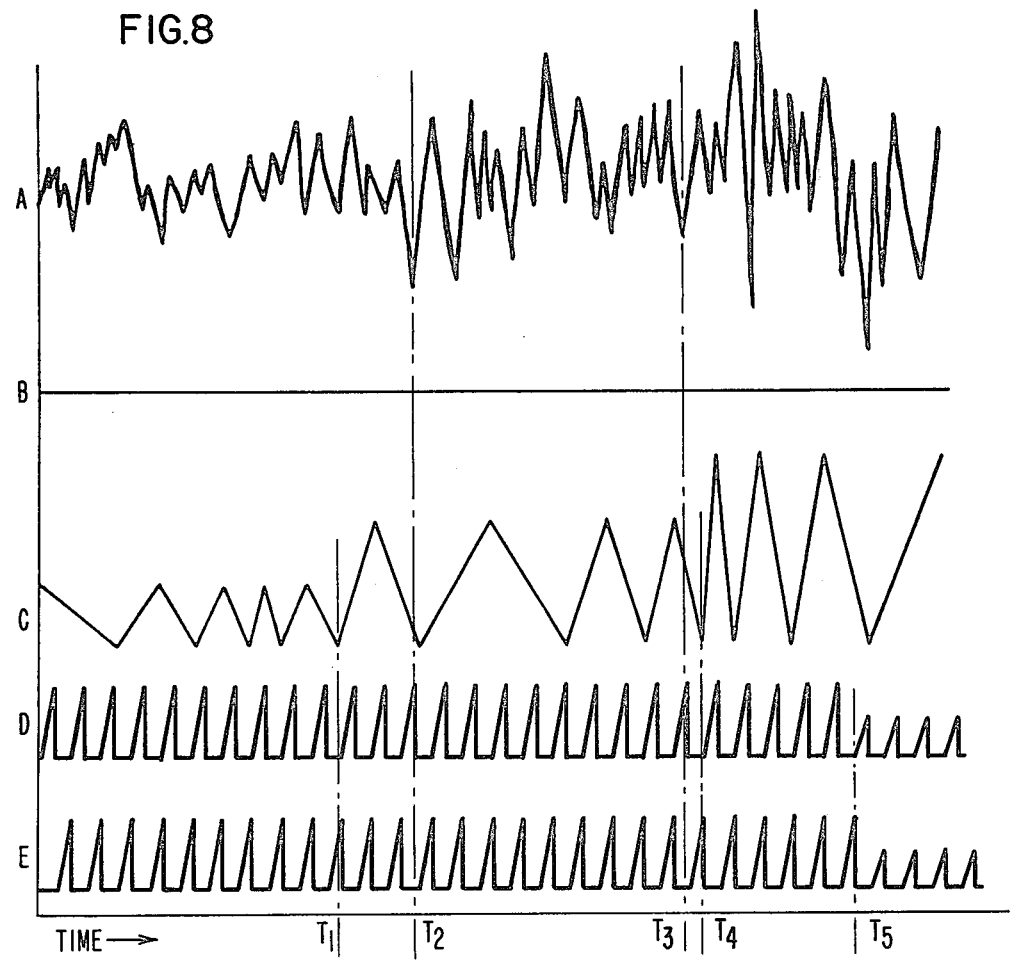
FIG. 8 shows the waveforms of FIG. 7 as they would be modified by changes in the noise bandwidth, wobbulated bandwidth and ramp bandwidth input signals.

As was illustrated in FIG. 4 in which the noise signal spectrum range characteristic was shown to be dependent on the weighting of the random noise signal, the center frequency to be dependent on the level of the center frequency signal, and the modulation of the noise signal spectrum to be dependent upon the amplitude and waveshape of the wobbulated waveform signal, it can be further shown that the quality and range of the noise signal spectrum are also dependent upon the waveshape of the ramp signals provided by the integrators 64 and 66. In FIG. 8, the waveforms 8-A, 8-B and 8-C are reproductions of the waveforms 4-A, 4-B and 4-C which were previously described in relation to FIG. 4. FIG. 8 further includes the waveforms 8-D and 8-E which show the ramp functions provided by the integrators 64 and 66, respectively. As in FIG. 4, the amplitude of the wobbulated waveform is changed at times $T_1$ and $T_4$ to control the amplitude of the noise signal spectrum modulation, and the amplitude of the random noise signal is changed at times $T_2$ and $T_3$ to control the range of the noise signal spectrum. FIG. 8 further illustrates that at time $T_5$, the ramp functions of waveforms 8-D and 8-E are changed so that they have a lower slope than that previous to time $T_5$. This change in the slope of the ramp signal will change the degree of definition between the spectral value of the noise signal spectrum, thereby changing the quality of the noise signal spectrum. Waveforms 8-D and 8-E also show that the amplitude of the ramp functions changes at time $T_5$. This change in amplitude will control the range of the voltage values in the noise signal output voltage, thereby controlling the range of the noise signal spectrum.

In the preferred embodiment of FIG. 6, this change in slope and amplitude of the ramp signal is accomplished by changing the magnitude of the ramp signal provided to the ramp bandwidth memory 54. Since the time period of the integrators 64 and 66 is constant, this change in magnitude will cause a change in both the slope and amplitude of the ramp function signal provided by the integrators 64 and 66.

As with the previously described modification of the embodiment of FIG. 1, the rate of switching between the D/A converters 44 and 46 of the embodiment of FIG. 6 can also be made irregular to further enhance the random nature of the noise generator output signal spectrum. By varying the switching rate of the switch 48 within a predetermined range, the power level of the noise signal spectrum can be correspondingly varied over a predetermined range. The previously described mechanism for varying the switching rate of the switch 48 by controlling the count rate of the address counter 36 in response to a random number generator can also be employed for the embodiment of FIG. 6. However, in the embodiment of FIG. 6, it has been explained that the ramp function outputs of the integrators 64 and 66 are also dependent on the enable signal on line 38 and the switching rate of the switch 48. That is, if the switching rate of the switch 48 is varied as was described in relation to FIGS. 1 and 5 without making corresponding adjustments in the values that are being integrated by the integrators 64 and 66, variance in the switching rate of the switch 48 will also result in variance of the amplitude of the ramp function outputs of the integrators 64 and 66. Accordingly, to maintain a uniform ramp output signal in response to a ramp value provided by the ramp bandwidth memory 54 despite variance of the switching rate of the switch 48, the ramp value provided by the ramp bandwidth memory 54 is scaled in relation to the count rate of the address counter 36. Specifically, the embodiment of FIG. 6 is further provided with first and second multipliers that are responsive to the even ramp register 56 and the odd ramp register 58, and that are also responsive to the count rate for the address counter 36 as determined by the random number generator. These first and second multipliers operate to multiply the outputs of the even ramp register 56 and the odd ramp register 58 by a factor determined by the count rate of the address counter 36. The value of the multiplication factor of the first and second multipliers is such that the multipliers appropriately scale the outputs of the even ramp register 56 and the odd ramp register 58 such that the values that are integrated by the integrators 64 and 66 provide a uniform ramp output signal in response to a particular ramp value provided by the ramp bandwidth memory 54 despite variance of the switching rate of the switch 48. That is, although the time limits for the integrators 64 and 66 vary in response to the variance of the switching rate of the switch 48, the integrators 64 and 66 provide a uniform ramp output signal in response to a particular ramp value provided by the ramp bandwidth memory 54 because the values that are being integrated are scaled by first and second multipliers in relation to the switching rate that determines the integration time.

In accordance with the above description of the preferred embodiment, a noise generator has been described which is responsive to digital noise quality input signals and digital noise modulation input signals to generate an analog noise signal having a spectrum of controlled center frequency, quality, modulation and range. In accordance with the present invention, the noise generator multiplies and sums the digital input signals in their digital form prior to a conversion to an equivalent analog signal suitable for controlling a voltage controlled oscillator to significantly increase the operational speed of the noise generator and to reduce the cost of its manufacture. Also, in an alternative embodiment, the noise generator is responsive to a second digital noise quality input signal which further controls the quality and range of the noise signal spectrum produced by the noise generator.

We claim:

1. A digital noise signal generator comprising:
   first means for generating a noise product signal in response to a noise bandwidth input signal and a random noise signal;
   second means for generating a wobbulated waveform product signal in response to a wobbulated bandwidth input signal, and a wobbulated waveform input signal;
   means for combining the noise product signal and the wobbulated waveform product signal in response to the output of said first and second generating means; and
   third means for generating an analog noise signal in response to the digital output of said combining means.

2. A noise generator that is responsive to digital input control signals to provide an analog noise signal, said generator comprising:
   a noise source for generating a random noise signal;
   means for storing a wobbulated waveform input signal;
   means for combining that is operative with the noise source and responsive to the storing means to provide a digital output signal in response to the random noise signal and the wobbulated waveform input signals.

3. A noise generator that is responsive to digital input control signals to provide an analog noise signal, said noise generator comprising:
   a noise source for generating a random noise signal;
   first means for storing a center frequency input signal;
   second means for storing a wobbulated waveform input signal;
   means for combining that is operative with said noise source and said first and second storing means to provide a digital noise signal in response to the random noise signal and the center frequency and wobbulated waveform input signals.

4. The apparatus of claim 3 further comprising:
   means for weighting the noise signal of said noise source in response to a noise bandwidth input signal.

5. The apparatus of claim 3 further comprising:
   means for weighting the wobbulated waveform input signal in response to a wobbulated bandwidth input signal.

6. The apparatus of claim 3 wherein said first and second storing means are comprised of digital memories.

7. The apparatus of claim 4 wherein said weighting means includes:
   a digital memory for storing the noise bandwidth input signal; and
   a multiplier that is responsive to the digital memory and to said noise source for weighting the random noise signal in response to the noise bandwidth input signal.

8. The apparatus of claim 5 wherein said weighting means includes:
   a digital memory for storing the wobbulated bandwidth input signal; and
   a multiplier that is responsive to the digital memory and to said second storing means for weighting the wobbulated waveform signal in response to the wobbulated bandwidth input signal.

9. The apparatus of claim 3 further comprising:
   means for converting the output of said combining means from a digital form to an analog form.

10. The apparatus of claim 9 wherein said converting means includes:
    a first digital-to-analog converter for providing an analog output signal in response to alternate outputs of said combining means;
    a second digital-to-analog converter for providing an analog output signal in response to the remaining outputs of said combining means; and
    a switch for conducting the output of the first digital-to-analog converter at times when that converter is responsive to alternate outputs of said combining means, and for conducting the output of the second digital-to-analog converter at times when that converter is responsive to the remaining outputs of said combining means.

11. A noise generator that is responsive to noise quality input signals and noise modulation input signals to generate analog noise signals having a noise signal spectrum of controlled quality and character, said noise generator comprising:
    a noise source that provides a random noise output signal that determines the quality of the noise signal spectrum;
    first means for weighting the random noise signal, said means being operative with the noise source and responsive to a noise bandwidth input signal to weight the noise signal in response to the noise bandwidth signal to control the range of the noise signal spectrum;
    first means for storing a center frequency input signal that determines the center frequency of the noise signal spectrum;
    second means for storing a wobbulated waveform input signal that determines the modulation of the noise signal spectrum;
    second means for weighting the wobbulated waveform input signal, said means operative with the second storing means and responsive to a wobbulated bandwidth input signal to weight the wobbulated waveform input signal in response to the wobbulated bandwidth input signal to control the amplitude of the noise signal spectrum modulation;
    means for combining the weighted wobbulated waveform input signal, the center frequency input signal, and the weighted random noise signal, in response to the outputs of the first storing means and the first and second weighting means; and
    means for converting the output of said combining means to an analog signal in response to the digital output of said combining means.

12. The noise generator of claim 11 wherein said second weighting means includes:

a third means for storing the wobbulated bandwidth input signal; and a multiplier that provides the product of the wobbulated waveform input signal and the wobbulated bandwidth input signal in response to the outputs of said second and third storing means.

13. The noise generator of claim 12 wherein said first weighting means includes:

a fourth means for storing the noise bandwidth input signal; and a multiplier that provides the product of the random noise signal and the noise bandwidth signal in response to the outputs of the fourth storing means and the noise source.

14. The noise generator of claim 13 wherein said converting means includes:

a first digital-to-analog converter that is operative with said combining means to provide an analog noise signal spectrum in response to a first set of selected outputs of said combining means;

a second digital-to-analog converter that is operative with said combining means to provide an analog noise signal spectrum in response to a second set of selected outputs of said combining means; and a switch to selectively connect one of said first and second digital-to-analog converters to an output terminal to selectively conduct the analog noise signals of the first and second digital-to-analog converters to an output terminal.

15. The noise generator of claim 14 wherein said first, second, third and fourth storing means store a plurality of control input signals and said storing means are selectively accessed to cause said noise generator to provide a noise signal spectrum in response to each access of said storing means.

16. The noise generator of claim 15 wherein the first digital-to-analog converter of said converting means is responsive to alternately selected outputs of said combining means, and the second digital-to-analog converter is responsive to the remaining outputs of said combining means.

17. The noise generator of claim 11 further comprising:

fifth means for storing a ramp input control signal that cooperates with the random noise signal to determine the quality of the noise spectrum produced by the noise generator;

second means for converting the ramp input control signal of said fifth storing means to an analog form;

means for integrating the analog output of said second converting means; and second means for combining the output of said integrating means and the output of said first converting means to provide a noise signal spectrum.

18. The noise generator of claim 17 wherein said second converting means includes:

a third digital-to-analog converter operative with said fifth storing means to provide an analog ramp signal in response to a first set of selected outputs of said fifth storing means; and a fourth digital-to-analog converter operative with said fifth storing means to provide an analog ramp signal in response to a second set of selected outputs of said fifth storing means.

19. A method for generating a noise signal in response to digital noise quality control signals and in response to first and second noise modulation control signals, said method comprising:

controlling a random noise signal in response to the digital noise quality control signal;

controlling the first digital modulation control signal in response to the second digital modulation control signal;

adding the controlled random noise signal to the controlled first digital modulation signal to provide a digital noise signal; and converting the digital noise signal to an analog noise signal.

20. A method for controlling the spectrum of a noise signal generator in response to a random noise signal, a noise bandwidth signal, a center frequency signal, a wobbulated waveform signal, and a wobbulated bandwidth signal, said method comprising:

multiplying the random noise signal by the noise bandwidth signal;

multiplying the wobbulated waveform signal by the wobbulated bandwidth signal;

adding the center frequency signal, the product of the random noise signal and the noise bandwidth signal, and the product of the wobbulated waveform signal and the wobbulated bandwidth signal to provide a digital noise signal having a controlled spectrum; and converting the controlled digital noise signal to a controlled analog noise signal.

21. The method of claim 20 further comprising:

converting a digital ramp input signal to an analog ramp input signal;

integrating the analog ramp input signal; and adding the integrated ramp input signal to the controlled analog noise signal.

22. A method for generating a controlled noise signal spectrum in response to digital control signals for controlling the quality, center frequency, bandwidth, and modulation of the noise signal spectrum, said method comprising:

multiplying a random noise signal that controls the quality of the noise signal spectrum by a noise bandwidth signal that controls the bandwidth of the noise signal spectrum;

multiplying a wobbulated waveform signal for controlling the modulation of the noise signal spectrum by a wobbulated bandwidth signal for controlling the amplitude of the modulation of the noise signal spectrum;

adding a center frequency signal for controlling the center frequency of the noise signal spectrum, the product of the random noise signal and the noise bandwidth signal, and the product of the wobbulated waveform signal and the wobbulated bandwidth signal to provide a digital noise signal having a controlled spectrum; and converting the digital noise signal to an analog noise signal.

23. The method of claim 22 further comprising:

converting a digital ramp signal for further controlling the quality of the noise signal spectrum to an analog ramp signal;

integrating the analog ramp signal; and adding the integrated ramp signal to the analog noise signal.

* * * * *